(12) United States Patent
Ishikawa

(10) Patent No.: US 6,402,009 B1
(45) Date of Patent: Jun. 11, 2002

(54) APPARATUS AND METHOD FOR SHAPING LEAD FRAME FOR SEMICONDUCTOR DEVICE AND LEAD FRAME FOR SEMICONDUCTOR DEVICE

(75) Inventor: Nobuhisa Ishikawa, Oita (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/504,852

(22) Filed: Feb. 16, 2000

(30) Foreign Application Priority Data

Feb. 22, 1999 (JP) .......................................... 11-043253

(51) Int. Cl.$^7$ ........................................... H01L 23/495
(52) U.S. Cl. .................... 228/6.2; 257/667; 257/669; 257/674; 257/666; 228/173.1; 228/173.2; 228/173.6; 228/174; 228/180.21; 228/4.5
(58) Field of Search ................................. 257/666, 667, 257/669, 674; 228/173.1, 173.2, 173.6, 174, 6.2, 4.5, 180.21

(56) References Cited

U.S. PATENT DOCUMENTS

| | | | |
|---|---|---|---|
| 3,650,232 A | * | 3/1972 | Heinlen ...................... 113/119 |
| 4,099,660 A | * | 7/1978 | Schultz et al. ................ 228/13 |
| 5,458,158 A | * | 10/1995 | Kawanabe ................... 140/105 |
| 6,277,225 B1 | * | 8/2001 | Kinsman et al. ............. 156/196 |

FOREIGN PATENT DOCUMENTS

| | | | | |
|---|---|---|---|---|
| JP | 09-08195 A | * | 1/1997 | .......... H01L/23/50 |
| JP | 11-260991 A | * | 9/1999 | .......... H01L/23/50 |

* cited by examiner

*Primary Examiner*—Eddie Lee
*Assistant Examiner*—Matthew E. Warren
(74) *Attorney, Agent, or Firm*—Sonnenschein, Nath & Rosenthal

(57) ABSTRACT

In apparatus and method for shaping a lead frame for a semiconductor device, there are provided a lower die having a concave shape for forming a step portion on the lower surface of the lead frame through a slope shape, an upper die having a convex shape which is downwardly moved to press a part of the lead frame in cooperation with the lower die and form a step portion through a slope shape on the upper surface of the lead frame, and a press portion which is disposed around the upper die and presses the outer portion of the lead frame at the outside from the semiconductor element mount portion, wherein the lower die is divided into an outside portion having an inside surface whose outlook is coincident with that of the inside surface of the press portion, and an inside portion located so as to be adjacent to and extend inwardly from the outer portion, and the outside portion and the inside portion are designed so as to be relatively movable in up-and-down direction.

2 Claims, 8 Drawing Sheets

APPARATUS AND METHOD FOR SHAPING LEAD FRAME FOR SEMICONDUCTOR DEVICE AND LEAD FRAME FOR SEMICONDUCTOR DEVICE

BACKGROUND OF THE INVENTION

1. Field of the Invention

The present invention relates to apparatus and method for shaping a lead frame of a semiconductor device which are used to provide a step portion on a lead frame for a semiconductor device such as IC (Integrated Circuit), LSI (Large Scale Integrated circuit) so that a plate-shaped semiconductor element mount portion of the lead frame on which a semiconductor element is mounted is depressed from the surrounding horizontal portion, for example, and a lead frame for a semiconductor device.

2. Description of the Related Art

There are generally known various types of lead frames for semiconductor devices (hereinafter merely referred to as "lead frame") which are different from one another in constituent material, shape, etc. Of these lead frames, a lead frame 12 used for a resin-sealed type semiconductor device 10 as shown in FIG. 1 is well known.

The lead frame 12 is formed of a conductive metal thin plate 13 having a thickness of 0.1 to 0.2 mm, and a step portion is formed on the lead frame so as to be more deeply depressed as compared with the surrounding horizontal portion 14 thereof. The lead frame 12 has a plate-shaped semiconductor element mount portion 18 on which a semiconductor element 16 formed of silicon-based material is mounted, and the semiconductor element 16 is mounted through adhesive agent 20 on the semiconductor element mount portion 18.

The tip end portions of bonding wires 22 extending from the semiconductor element 16 are electrically connected to internal draw-out leads 24 of the lead frame 12, and the respective parts are sealed by sealing resin 26 such as epoxy resin as shown in FIG. 1. External draw-out leads 28 of the lead frame 12 are projected from the sealing resin 26 under the state that they are subjected to outer-sheath plating, shape working, etc.

When such a resin-sealed type semiconductor device 10 as described above is constructed by using a lead frame 12 as described above, it is required to make equal the thickness of the upper portion of the sealing resin 26 located at the upside from the semiconductor element 16 to the thickness of the lower portion of the sealing resin 26 at the downside from the semiconductor element mount portion 18. Therefore, a press working must be carried out to set a depression amount D so that the semiconductor element 16 and the semiconductor element mount portion 18 are located at the center in the height direction of the resin-sealed type semiconductor device 10 and make a step portion on the lead frame so that the semiconductor element mount portion 18 is depressed from the surrounding horizontal portion thereof by the depression amount D thus set.

Here, the process of manufacturing the semiconductor device lead frame 12 as described above will be described with reference to FIGS. 2A to 2C.

First, etching and stamping are applied to the plate-shaped conductive metal thin plate 13 as shown in FIG. 2A so that a shape which is approximately similar to the lead frame 12 is formed on the conductive metal thin plate 13 as shown in FIG. 2B.

Subsequently, plating is applied to the conductive metal thin plate 13 having the internal draw-out leads 24, the semiconductor element mount portion 18, etc. Thereafter, press working is applied to the conductive metal thin plate 13 thus plated as shown in FIG. 2C so that the semiconductor element mount portion 18 is depressed from the surrounding horizontal portion thereof as shown in FIG. 2C, thereby substantially completing the lead frame 12 with leaving the final stamping step.

A die instrument 30 as shown in FIG. 3 is used to perform the press working for depressing the semiconductor element mount portion 18 at the center portion of the lead frame 12. That is, a concave shape 32 is formed on a die 31 serving as a lower die by electric discharge machining or the like, and the overall body of the die 31 is designed as an integrated body which is continuous in the horizontal direction.

A convex shape 36 is formed on a punch 34 serving as an upper die through a finishing treatment using cutting work or the like, and the length of the punch 34 is set to be smaller than the die 31 in the horizontal direction. Further, a cavity 34a is formed at the center of the punch 34, and a stopper 38 for pressing the conductive metal thin plate 13 in the shaping process is provided around the punch 34 so as to be upwardly and downwardly movable independently of the punch 34.

The procedure of the press working for depressing the semiconductor element mount portion 18 of the lead frame 12 by using the die instrument 30 will be described hereunder with reference to FIGS. 4A to 4C. That is, as shown in FIG. 4A, the conductive metal thin plate 13 is positioned and mounted on the die 31.

Subsequently, as shown in FIG. 4B, the stopper 38 is downwardly moved to press and fix the conductive metal thin plate 13. Finally, as shown in FIG. 4C, the punch 34 is downwardly moved to sandwich the conductive metal thin plate 13 between the convex shape 36 of the punch 34 and the concave shape 32 of the die 31 and press and properly crush the sandwiched portion, thereby completing the working.

However, the conventional shaping method of depressing the semiconductor element mount portion 18 of the lead frame 12 has such a problem that it is very difficult to adjust the depression amount D in FIG. 1 after the working is completed.

That is, even when the punch 34 and the die 31 are manufactured under the condition that the projection amount of the convex shape 36 of the punch 34 and the recess amount of the concave shape 32 of the die 31 are coincident with the depression amount D or slightly different from the depression amount D, the depression amount D of the lead frame 12 after the press working is completed is not necessarily coincident with an expected dimensional value. This is because the depression amount D is effected by various factors such as the material, thickness and shape of the lead frame 12.

Therefore, in a case where the actual depression amount D of the lead frame 12 is larger than an expected value, if the press force of the punch 34 is reduced in order to adjust the depression amount D to a smaller value, the depression amount D of the lead frame 12 is excessively reduced, so that the shaping is insufficiently carried out or the depression amount D is greatly dispersed.

On the other hand, in a case where the actual depression amount D of the lead frame 12 is smaller than an expected value, if the press force of the punch 34 is increased in order to adjust the depression amount D to a larger value, the conductive metal thin plate 13 is excessively compressed, so that the compressed portion is crushed and thus the mechanical strength of the lead frame is insufficient or the depression amount D is greatly dispersed.

In order to perfectly solve these problems, the punch 34 and the die 31 must be remade while slightly varying the projection amount of the convex shape 36 and the recess amount of the concave shape 32, resulting in remarkable increase of the manufacturing time and the manufacturing cost. In addition, even when the above manner is adopted, an expected result cannot be necessarily obtained.

SUMMARY OF THE INVENTION

Therefore, the present invention has been implemented in view of the foregoing problems, and has an object to provide apparatus and method for shaping a lead frame for a semiconductor device and a lead frame for a semiconductor device, which can broad the adjustment range of the depression amount of a semiconductor element mount portion and easily adjust the depression amount to be equal to an expected value with inducing neither insufficient shaping nor insufficient strength.

In order to attain the above object, according to a first aspect of the present invention, an apparatus for shaping a lead frame for a semiconductor device in which a step portion is formed on the lead frame so that a plate-shaped semiconductor element mount portion on which a semiconductor element is mounted is depressed from the surrounding horizontal portion thereof, is characterized by including: a lower die having a concave shape for forming a step portion on the lower surface of the lead frame through a slope shape; an upper die having a convex shape which is downwardly moved to press a part of the lead frame in cooperation with the lower die and form a step portion through a slope shape on the upper surface of the lead frame; and a press portion which is disposed around the upper die and presses the outer portion of the lead frame at the outside from the semiconductor element mount portion, wherein the lower die is divided into an outside portion having an inside surface whose outlook is coincident with that of the inside surface of the press portion, and an inside portion located so as to be adjacent to and extend inwardly from the outer portion, and the outside portion and the inside portion are designed so as to be relatively movable in up-and-down direction.

According to a second aspect of the present invention, a method of shaping a lead frame for a semiconductor device is characterized in that by using an apparatus for shaping a lead frame for a semiconductor device in which a step portion is formed on the lead frame so that a plate-shaped semiconductor element mount portion on which a semiconductor element is mounted is depressed from the surrounding horizontal portion thereof and which is characterized by including: a lower die having a concave shape for forming a step portion on the lower surface of the lead frame through a slope shape; an upper die having a convex shape which is downwardly moved to press a part of the lead frame in cooperation with the lower die and form a step portion through a slope shape on the upper surface of the lead frame; and a press portion which is disposed around the upper die and presses the outer portion of the lead frame at the outside from the semiconductor element mount portion, wherein the lower die is divided into an outside portion having an inside surface whose outlook is coincident with that of the inside surface of the press portion, and an inside portion located so as to be adjacent to and extend inwardly from the outer portion, and the outside portion and the inside portion are designed so as to be relatively movable in up-and-down direction, a work piece of the lead frame is mounted on the lower die; the press portion is downwardly moved so that the lower surface thereof is brought into contact with the upper surface of the outside portion of the lead frame extending outwardly from the semiconductor element mount portion to press the outside portion of the lead frame downwardly; the upper die presses down the semiconductor element mount portion so that the semiconductor element mount portion is depressed, thereby forming a step portion on the lead frame through a slope shape; and the height of the outside portion is adjusted with respect to the inside portion of the lower die to adjust the dimension of the step portion.

According to a third aspect of the present invention, a lead frame for a semiconductor device is characterized in that by using an apparatus for -shaping a lead frame for a semiconductor device in which a step portion is formed on the lead frame so that a plate-shaped semiconductor element mount portion on which a semiconductor element is mounted is depressed from the surrounding horizontal portion thereof, is characterized by including: a lower die having a concave shape for forming a step portion on the lower surface of the lead frame through a slope shape; an upper die having a convex shape which is downwardly moved to press a part of the lead frame in cooperation with the lower die and form a step portion through a slope shape on the upper surface of the lead frame; and a press portion which is disposed around the upper die and presses the outer portion of the lead frame at the outside from the semiconductor element mount portion, wherein the lower die is divided into an outside portion having an inside surface whose outlook is coincident with that of the inside surface of the press portion, and an inside portion located so as to be adjacent to and extend inwardly from the outer portion, and the outside portion and the inside portion are designed so as to be relatively movable in up-and-down direction, the lead frame is subjected to a shaping work of forming the step portion on the lead frame so that the semiconductor element mount portion is depressed from the surrounding horizontal portion thereof.

According to the above-described apparatus and method for shaping the lead frame, the work piece of the lead frame is mounted on the lower die, the press portion is downwardly moved so that the lower surface thereof is brought into contact with the upper surface of the outside portion of the lead frame extending outwardly from the semiconductor element mount portion to press downwardly, the upper die is downwardly moved to press the semiconductor element mount portion so that the semiconductor element mount portion is depressed, thereby forming the step portion on the lead frame through the slope shape, and the height of the outside portion is adjusted with respect to the inside portion of the lower die, whereby the dimension of the step portion can be adjusted.

Further, according to the above-described apparatus and method for shaping the lead frame, the shaping work of forming a step portion is performed so that the semiconductor element mount portion is depressed from the surrounding horizontal portion thereof, whereby there can be obtained a semiconductor device lead frame in which the depression amount of the semiconductor element mount portion is coincident with an expected value.

DESCRIPTION OF THE PREFERRED EMBODIMENTS

Figure 1:
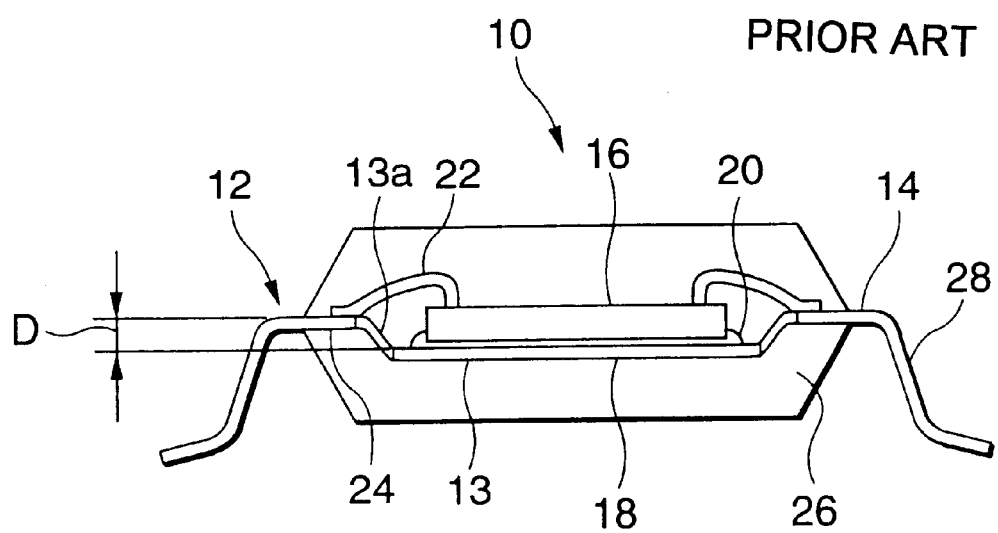
FIG. 1 is a sectional side view showing a resin-sealed type semiconductor device.

Preferred embodiments according to the present invention will be described in detail hereunder with reference to the accompanying drawings.

The apparatus and method for shaping a semiconductor device lead frame, and a lead frame for a semiconductor device according to the present invention will be described with reference to FIGS. 5 to 12.

There are generally known various types of lead frames for semiconductor devices (hereinafter merely referred to as "lead frame") which are different from one another in constituent material, shape, etc. Of these lead frames, a lead frame 12 used for a resin-sealed type semiconductor device 10 as shown in FIG. 1 is well known.

The lead frame 12 is formed of a conductive metal thin plate 13 having a thickness of 0.1 to 0.2 mm, and a step portion is formed on the lead frame so as to be more deeply depressed as compared with the surrounding horizontal portion 14 thereof. The lead frame 12 has a plate-shaped semiconductor element mount portion 18 on which a semiconductor element 16 formed of silicon-based material is mounted, and the semiconductor element 16 is mounted through adhesive agent 20 on the semiconductor element mount portion 18.

The tip end portions of bonding wires 22 extending from the semiconductor element 16 are electrically connected to internal draw-out leads 24 of the lead frame 12, and the respective parts are sealed by sealing resin 26 such as epoxy resin as shown in FIG. 1. External draw-out leads 28 of the lead frame 12 are projected from the sealing resin 26 under the state that they are subjected to outer-sheath plating, shape working, etc.

When such a resin-sealed type semiconductor device 10 as described above is constructed by using a lead frame 12 as described above, it is required to make equal the thickness of the upper portion of the sealing resin 26 located at the upside from the semiconductor element 16 to the thickness of the lower portion of the sealing resin 26 at the downside from the semiconductor element mount portion 18. Therefore, a press working must be carried out to set a depression amount D so that the semiconductor element 16 and the semiconductor element mount portion 18 are located at the center in the height direction of the resin-sealed type semiconductor device 10 and make a step portion on the lead frame so that the semiconductor element mount portion 18 is depressed from the surrounding horizontal portion thereof by the depression amount D thus set.

Here, the process of manufacturing the semiconductor device lead frame 12 as described above will be described with reference to FIGS. 2A to 2C.

Figure 2A:
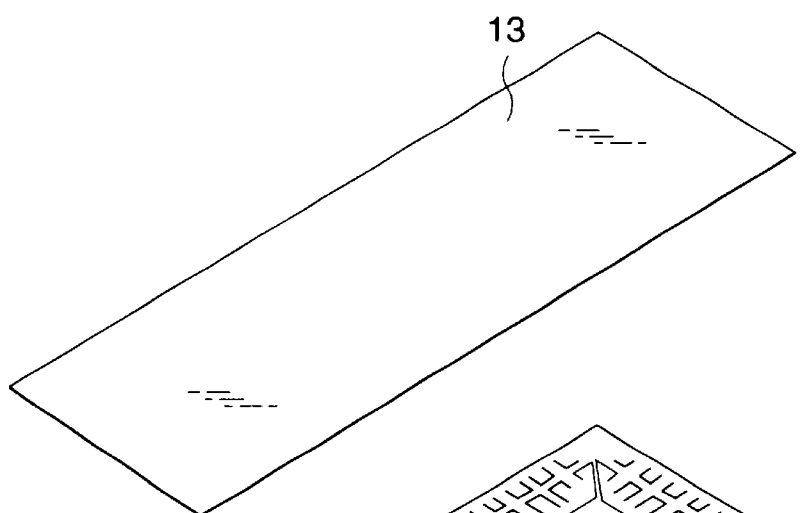
FIGS. 2A to 2C are perspective views showing working steps of a conductive metal thin plate.
Figure 2B:
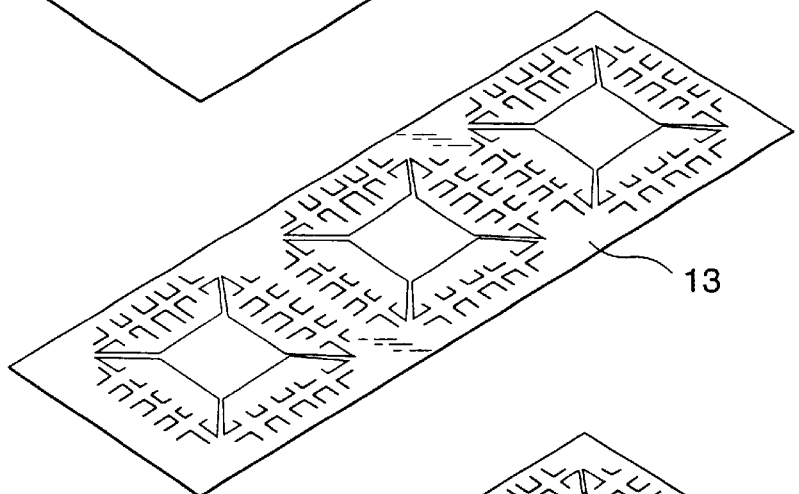
Figure 6:
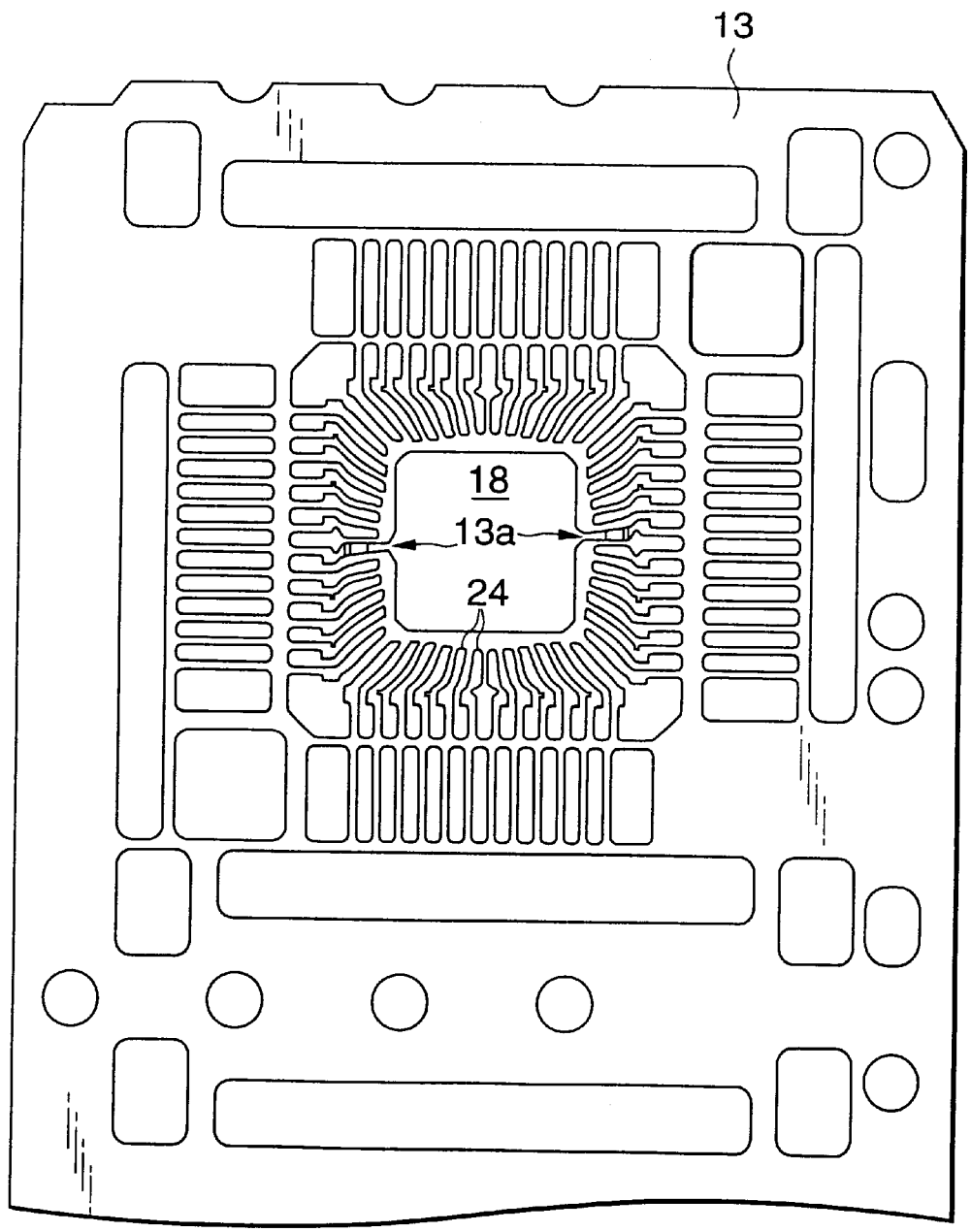
FIG. 6 is a partially enlarged plan view showing the conductive metal thin plate in FIG. 2B.

First, etching and stamping are applied to the plate-shaped conductive metal thin plate 13 as shown in FIG. 2A so that a shape which is approximately similar to the lead frame 12 is formed on the conductive metal thin plate 13 as shown in FIG. 2B, and FIG. 6 more in detail.

Figure 2C:
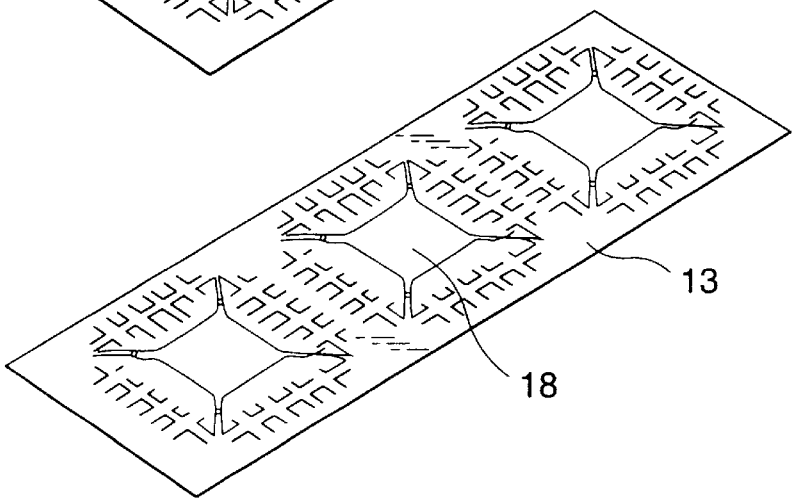
Figure 3:
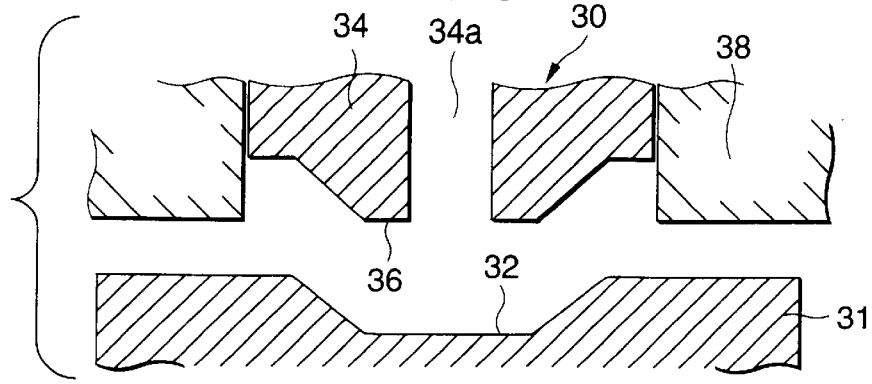
FIG. 3 is a cross-sectional view showing a conventional die instrument.
Figure 4A:
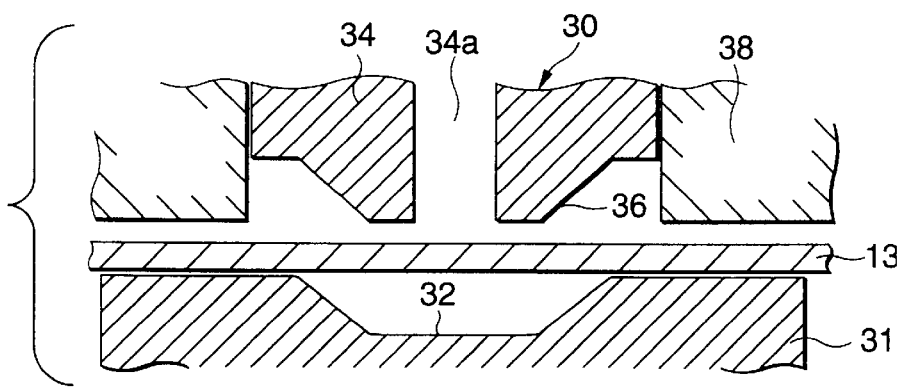
FIGS. 4A to 4C are cross-sectional views showing the operation of the die instrument.
Figure 4B:
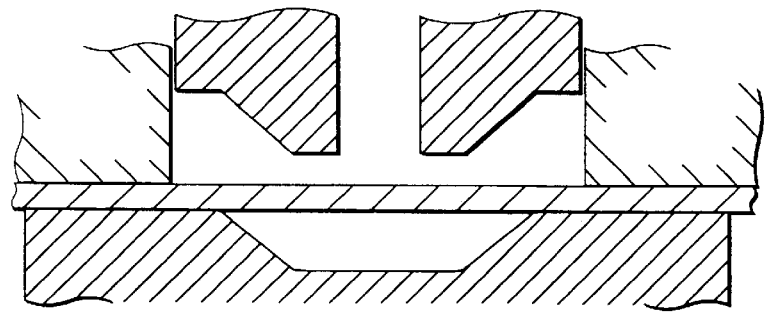
Figure 4C:
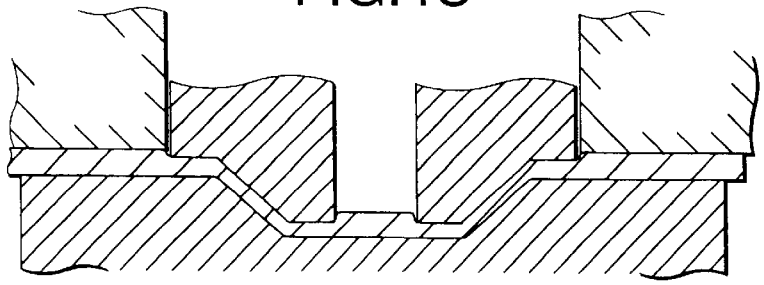

Subsequently, plating is applied to the conductive metal thin plate 13 having the internal draw-out leads 24, the semiconductor element mount portion 18, etc. Thereafter, press working is applied to the conductive metal thin plate 13 thus plated as shown in FIG. 2C so that the semiconductor element mount portion 18 is depressed from the surrounding horizontal portion thereof as shown in FIG. 2C, thereby substantially completing the lead frame 12 with leaving the final stamping step.

Figure 5:
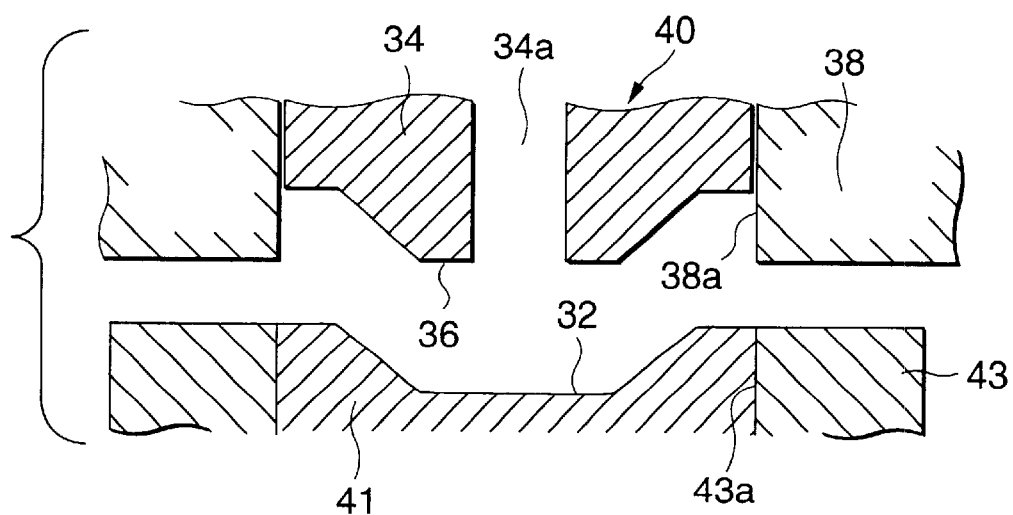
FIG. 5 is a cross-sectional view showing a die instrument according to a first embodiment of the present invention.

In this embodiment, in order to perform the press working so that the semiconductor element mount portion 18 at the center portion of the lead frame 12 is depressed, a die instrument 40 as shown in FIG. 5 is used. That is, a concave shape 32 is formed on the die 41 (lower die) by electric discharge working or the like. Further, a convex shape 36 whose back surface is finished by the cutting work or the like and then subjected to smooth finishing (lapping finishing) is formed on the punch 34 (upper die). Further, a cavity 34a is formed at the center of the punch 34.

A stopper 38 (press portion) for pressing the conductive metal thin plate 13 in the shaping step is provided around the punch 34 so as to be upwardly and downwardly movable independently of the punch 34. Further, a adjustment die 43 (a part of the lower die) having an inside surface 43a at the same horizontal position as the position in the horizontal direction of the inside surface 38a of the stopper 38 is provided around the die 41 so as to be upwardly and downwardly movable relatively to the die 41.

The punch 34 and the die 41 of the die instrument 40 perform the press working so that the notched portions of suspended lead portions 13a of the conductive metal thin plate 13 of FIG. 6 are pinched by the slope portion of the convex shape 36 and the slope portion of the concave shape 32 from the upper and lower sides, whereby the semiconductor element mount portion 18 is depressed from the surrounding horizontal portion thereof.

The procedure of performing the press working so that the semiconductor element mount portion 18 of the lead frame 12 is depressed by using the die instrument 40 as described above will be described with reference to FIGS. 7A to 7C.

Figure 7A:
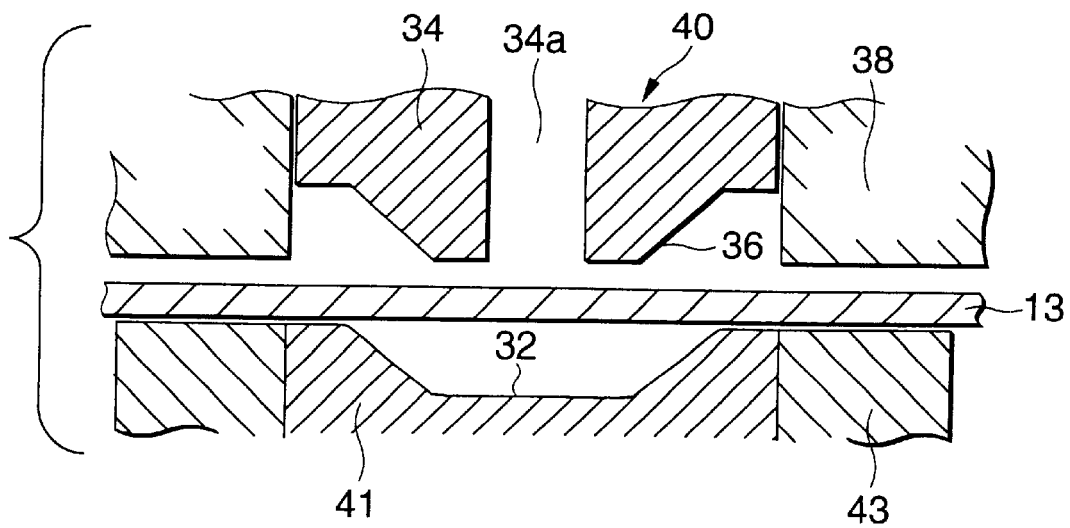
FIGS. 7A to 7C are cross-sectional views showing the operation of the die instrument.

That is, as shown in FIG. 7A, the conductive metal thin plate 13 is positioned and mounted on the die 41 and the adjustment die 43.

Figure 7B:
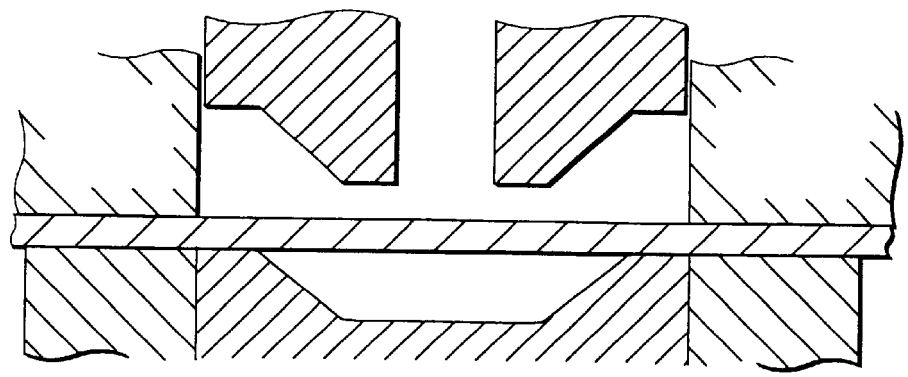
Figure 7C:
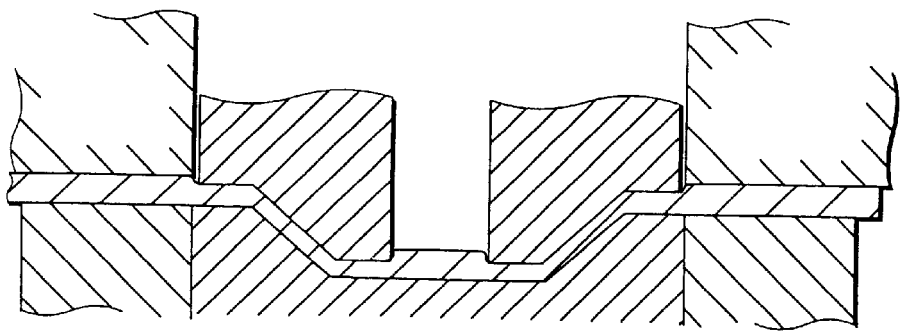

Subsequently, as shown in FIG. 7B, the stopper 38 is downwardly moved to press and fix the conductive metal thin plate 13. Finally, as shown in FIG. 7C, the punch 34 is downwardly moved to pinch the notched portions of the suspended leads 13a between the convex shape 36 of the punch 34 and the concave shape 32 of the die 41, and press and suitably crush the pinched portion, thereby completing the working.

After the press working is carried out, the suspended lead portions 13a which are crushed by the press force are observed to judge whether the working status is good or not.

Figure 8A:
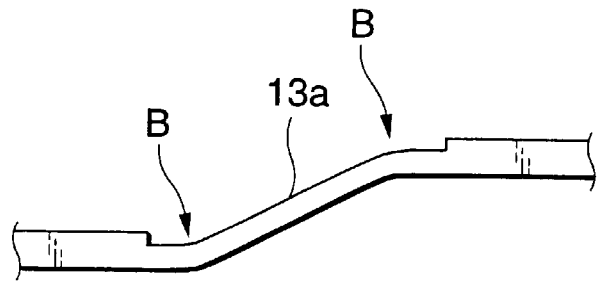
FIGS. 8A and 8B show a side view and a plan view which show the status of a pressed suspended lead portion.
Figure 8B:
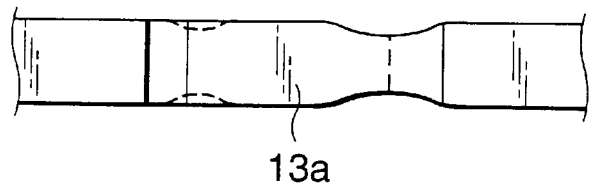

For example, when the corners are loose because the crush amount (plastic deformation amount) of each bent portion B of the suspended lead portion 13a is so small as shown in FIG. 8A that each bent portion B is not sharply bent and has an arcuate shape having a large radius as shown in FIG. 8A and the suspended lead portion 13a is partially narrow in width as shown in FIG. 8B, the press force of the punch 34 is weak. Accordingly, in this case, it is necessary to adjust the lower dead point of the punch 34 to a smaller value.

Figure 9A:
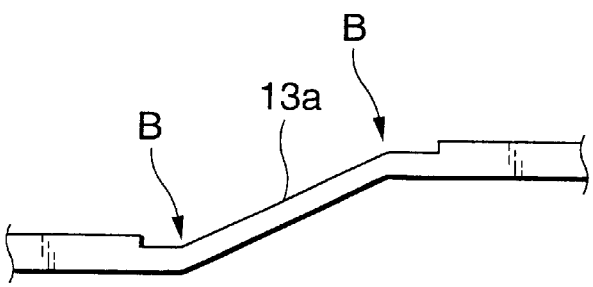
FIGS. 9A and 9B are side view and plan view which show the status of the pressed suspended lead portion.
Figure 9B:
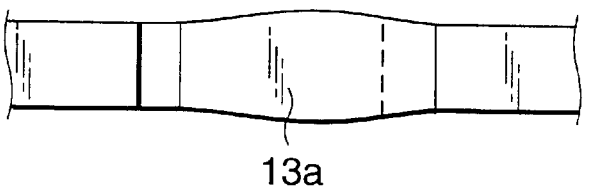

Further, when the suspended lead portion 13a is thick in width as shown in FIG. 9B although the bent portions B of the suspended lead portions 13a are sharply bent as shown in FIG. 9A, the press force of the punch 34 is excessively large and the crush amount is also too large, so that it is necessary to adjust the lower dead point of the punch 34 to a larger value.

Figure 10A:
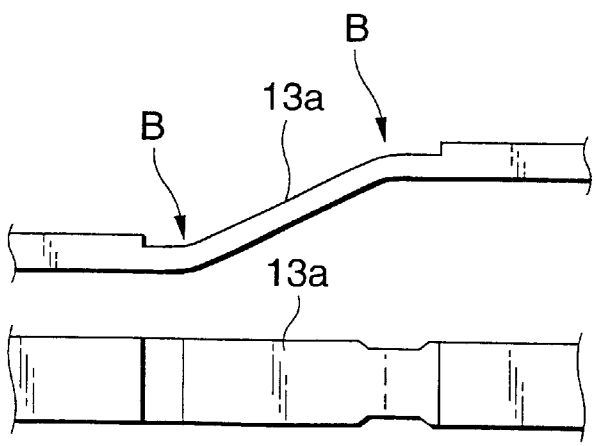
FIGS. 10A and 10B are side view and plan view which show the status of the pressed suspended lead portion.
Figure 10B:
Figure 11:
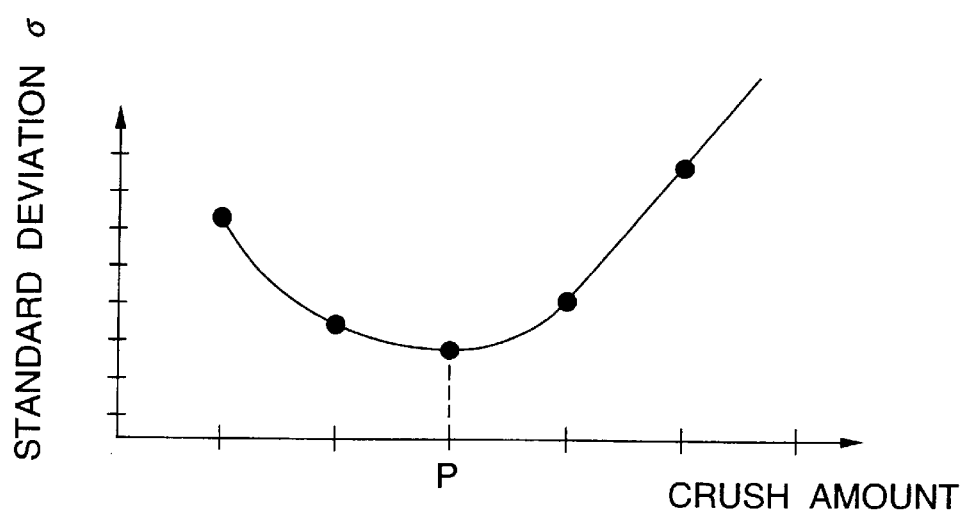
FIG. 11 is a graph showing the dispersion degree of the depression amount to the crush amount of the suspended lead portion.

By adjusting the lower dead point of the punch 34 upwardly and downwardly, the suspended lead portion 13a can be designed in an idealistic shape so that the bent portion B thereof is sharply bent as shown in FIG. 10A and the width of the suspended lead portion 13a is uniform as shown in FIG. 10B. In this case, the crush amount is equal to an appropriate value P as shown in FIG. 11 and thus the dispersion (standard deviation σ) is reduced to the minimum value.

The depression amount D is measured for plural lead frames 12. If the average value thereof is equal to an expected value, there is no problem. However, if the average value is larger than the expected value, the adjustment die 43 is adjusted so that the top surface of the adjustment die 43 is slightly lower than the top surface of the die 41, and then the press working is carried out again.

Figure 12:
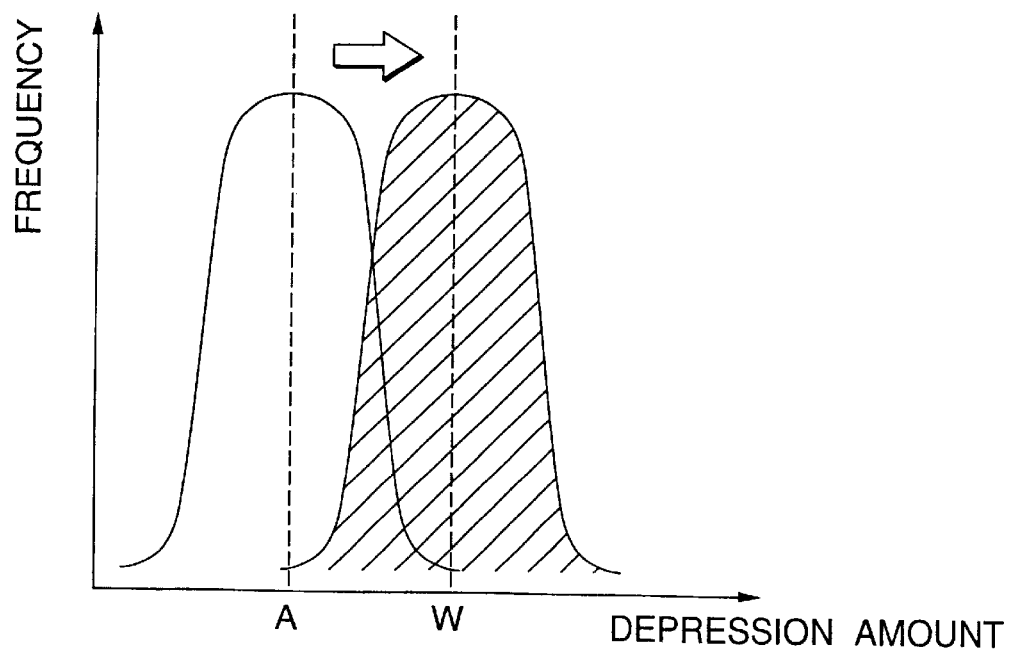
FIG. 12 is a graph showing the relationship between the measured average value of the depression amount of the suspended lead portion and its expected value.

Conversely, when the average value is smaller than the expected value, the adjustment die 43 is adjusted so that the top surface thereof is slightly higher than the top surface of the die 41, and then the press working is carried out again. By carrying out the press working after the adjustment is made as described above, the average value A can be made coincident with the expected value W as shown in FIG. 12.

Therefore, the adjustment range of the depression amount D of the semiconductor element mount portion 18 can be more enlarged as compared with the prior art, and the adjustment can be easily made on the depression amount so that the depression amount D is made coincident with the expected value without inducing insufficient shaping and insufficient mechanical strength. Accordingly, there can be avoided such a situation as to remake the punch 34 and the die 41. This effect also facilitates the design and manufacturing of the punch 34 and the die 41 of the die instrument 40.

Further, since the surface of the convex shape 36 of the punch 34 is subjected to the smooth finishing, the plating of the conductive metal thin plate 13, etc. can be prevented from being peeled off and adhering/depositing onto the surface of the convex shape 36, so that the depression amount D of the lead frame 12 can be prevented from being greatly dispersed due to the deposition of the plating or the like.

As described above, the embodiments of the present invention are described above in detail. However, the present invention is not limited to the above embodiments, and various modifications may be-made on the basis of the technical idea of the present invention.

As described above, according to the apparatus and method for shaping the lead frame for the semiconductor device of the present invention, the adjustment range of the depression amount of the semiconductor element mount portion can be enlarged, and the adjustment of the depression amount can be made so that the depression amount is easily made coincident with the expected value without inducing the insufficient shaping and the insufficient mechanical strength.

Further, according to the apparatus and method for shaping the lead frame for the semiconductor device of the present invention, there can be performed the shaping work of forming the step portion so that the semiconductor element mount portion is depressed from the surrounding horizontal portion, thereby obtaining a lead frame for a semiconductor device in which the depression amount is coincident with the expected value.

What is claimed is:

1. An apparatus for shaping a lead frame for a semiconductor device in which a step portion is formed on the lead frame so that a plate-shaped semiconductor element mount portion on which a semiconductor element is mounted is depressed from the surrounding horizontal portion thereof, characterized by including:

a lower die having a concave shape for forming a step portion on the lower surface of said lead frame through a slope shape;

an upper die having a convex shape which is downwardly moved to press a part of said lead frame in cooperation with said lower die and form a step portion through a slope shape on the upper surface of said lead frame; and a press portion which is disposed around said upper die and presses the outer portion of the lead frame at the outside from the semiconductor element mount portion, wherein said lower die is divided into an outside portion having an inside surface whose outlook is coincident with that of the inside surface of said press portion, and an inside portion located so as to be adjacent to and extend inwardly from said outer portion, and said outside portion and said inside portion are designed so as to be relatively movable in up-and-down direction.

2. The apparatus for shaping the lead frame for the semiconductor device as claimed in claim 1, wherein the surface of the slope shape of at least one of said convex shape of said upper die and said concave shape of said lower die is subjected to smooth finishing working.

* * * * *